United States Patent [19]
Shibata et al.

[11] Patent Number: 6,074,276
[45] Date of Patent: Jun. 13, 2000

[54] POLISHING APPARATUS

[75] Inventors: Miki Shibata, Fujisawa; Toyomi Nishi, Yokohama; Hidetaka Nakao, Ebina; Tetsuji Togawa, Chigasaki, all of Japan

[73] Assignee: Ebara Corporation, Tokyo, Japan

[21] Appl. No.: 09/215,147

[22] Filed: Dec. 18, 1998

Related U.S. Application Data

[62] Division of application No. 08/843,593, Apr. 16, 1997, Pat. No. 5,885,134.

[30] Foreign Application Priority Data

Apr. 18, 1996 [JP] Japan .................................... 8-122243

[51] Int. Cl.$^7$ ....................................................... B24B 7/24
[52] U.S. Cl. .................................. 451/8; 451/41; 451/60; 451/285; 451/286; 451/5
[58] Field of Search .............................. 451/5, 8, 41, 60, 451/285, 286; 132/312

[56] References Cited

U.S. PATENT DOCUMENTS 5,127,196   7/1992   Morimoto et al. .
5,498,199   3/1996   Karlsrud et al. .
5,570,714   11/1996  Magish .

FOREIGN PATENT DOCUMENTS 26 06 656   8/1977   Germany .
30 04 520   8/1981   Germany .
8-102459    4/1996   Japan .

*Primary Examiner*—David A. Scherbel
*Assistant Examiner*—George Nguyen
*Attorney, Agent, or Firm*—Wenderoth, Lind & Ponack, L.L.P.

[57] ABSTRACT

A polishing apparatus is used for polishing a workpiece such as a semiconductor wafer to a flat mirror finish. The polishing apparatus includes a polishing section for polishing a surface of a workpiece, a cleaning section for cleaning the workpiece which has been polished, a first liquid leakage sensor provided in the polishing section for detecting a liquid leakage which occurs in the polishing section, and a second liquid leakage sensor provided in the cleaning section for detecting a liquid leakage which occurs in the cleaning section. The polishing apparatus further includes a controlling device for stopping the supply of liquid to the polishing section or the cleaning section in which the liquid leakage occurs when either one of the first and second liquid leakage sensors detects the liquid leakage.

5 Claims, 8 Drawing Sheets

| | | OPERATION OF THE APPARATUS | | | |
|---|---|---|---|---|---|
| | | POLISHING SECTION 60 | CLEANING SECTION 80 | ABRASIVE LIQUID SUPPLY DEVICE 120 | COOLING WATER SUPPLY DEVICE 100 |
| LIQUID LEAKAGE DETECTING LOCATION | POLISHING SECTION 60 | POLISHING SECTION 60 SHUT OFF | OPERATION CONTINUED | ABRASIVE LIQUID CIRCULATION PUMP SHUT OFF | OPERATION CONTINUED |
| | | SHUTOFF VALVE V11 CLOSED SHUTOFF VALVE V12 CLOSED SHUTOFF VALVE V13 CLOSED | | | |
| | CLEANING SECTION 80 | OPERATION CONTINUED | CLEANING SECTION 80 SHUT OFF | OPERATION CONTINUED | OPERATION CONTINUED |
| | | | SHUTOFF VALVE V14 CLOSED | | |
| | ABRASIVE LIQUID SUPPLY DEVICE 120 | POLISHING SECTION 60 SHUT OFF | OPERATION CONTINUED | ABRASIVE LIQUID SUPPLY DEVICE 120 SHUT OFF | OPERATION CONTINUED |
| | | | | SHUTOFF VALVE V21 CLOSED SHUTOFF VALVE V22 CLOSED SHUTOFF VALVE V23 CLOSED | |
| | COOLING WATER SUPPLY DEVICE 100 | ALARM SIGNAL ISSUED TO CONTINUE OPERATION | OPERATION CONTINUED | OPERATION CONTINUED | COOLING WATER SUPPLY DEVICE 100 SHUT OFF |
| | | | | | SHUTOFF VALVE V31 CLOSED |

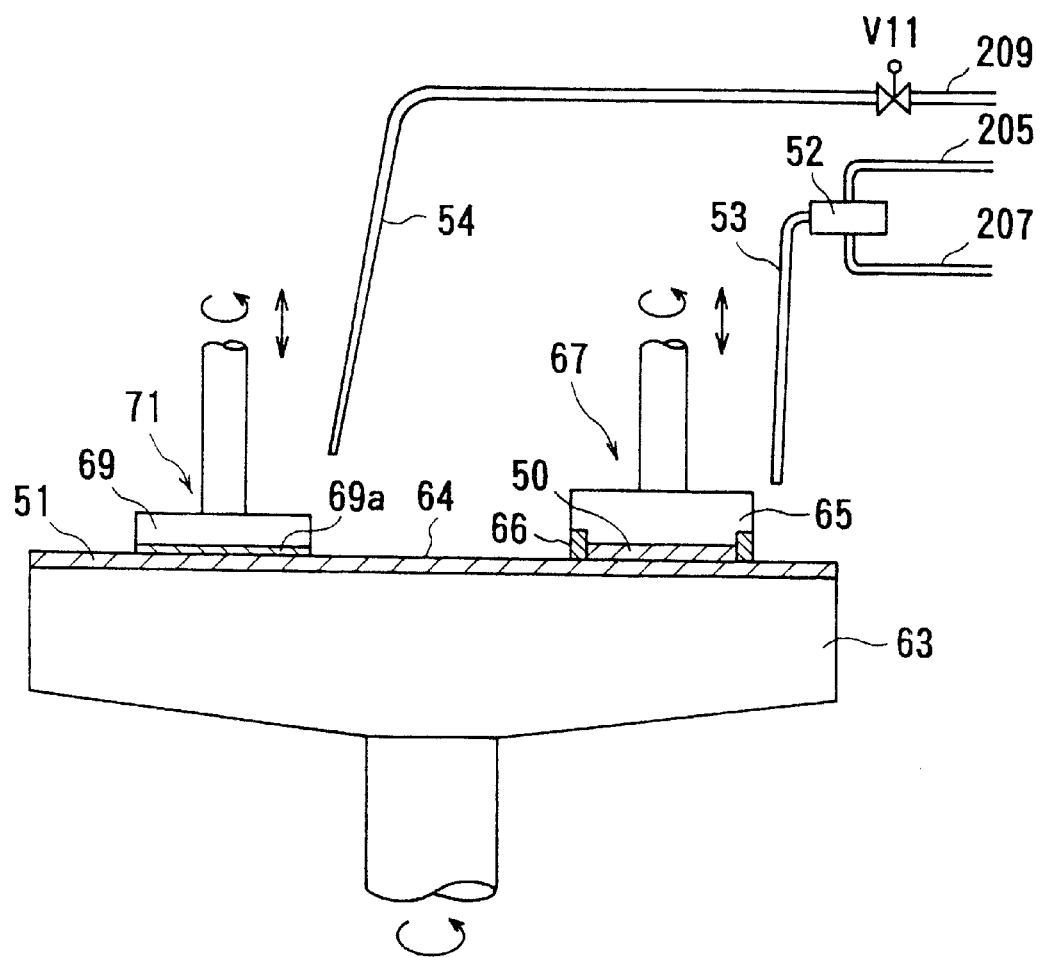
F I G. 2

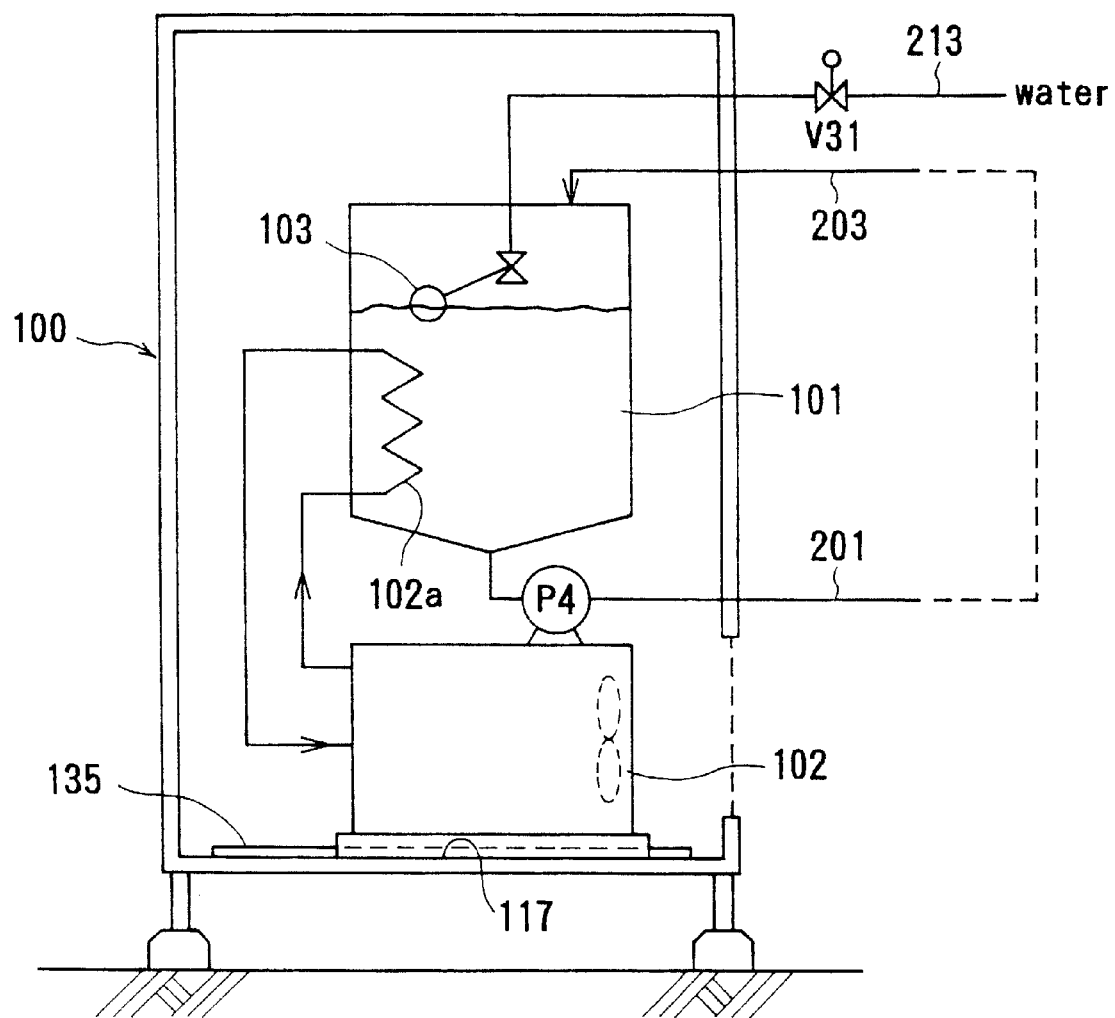
F I G. 7

FIG. 9

| LIQUID LEAKAGE DETECTING LOCATION | OPERATION OF THE APPARATUS ||||
|---|---|---|---|---|
| | POLISHING SECTION 60 | CLEANING SECTION 80 | ABRASIVE LIQUID SUPPLY DEVICE 120 | COOLING WATER SUPPLY DEVICE 100 |
| POLISHING SECTION 60 | POLISHING SECTION 60 SHUT OFF<br>SHUTOFF VALVE V11 CLOSED<br>SHUTOFF VALVE V12 CLOSED<br>SHUTOFF VALVE V13 CLOSED | OPERATION CONTINUED | ABRASIVE LIQUID CIRCULATION PUMP SHUT OFF | OPERATION CONTINUED |
| CLEANING SECTION 80 | OPERATION CONTINUED | CLEANING SECTION 80 SHUT OFF<br>SHUTOFF VALVE V14 CLOSED | OPERATION CONTINUED | OPERATION CONTINUED |
| ABRASIVE LIQUID SUPPLY DEVICE 120 | POLISHING SECTION 60 SHUT OFF | OPERATION CONTINUED | ABRASIVE LIQUID SUPPLY DEVICE 120 SHUT OFF<br>SHUTOFF VALVE V21 CLOSED<br>SHUTOFF VALVE V22 CLOSED<br>SHUTOFF VALVE V23 CLOSED | OPERATION CONTINUED |
| COOLING WATER SUPPLY DEVICE 100 | ALARM SIGNAL ISSUED TO CONTINUE OPERATION | OPERATION CONTINUED | OPERATION CONTINUED | COOLING WATER SUPPLY DEVICE 100 SHUT OFF<br>SHUTOFF VALVE V31 CLOSED |

POLISHING APPARATUS

This is a division of Ser. No. 08/843,593, filed Apr. 16, 1997, now U.S. Pat. No. 5,885,134, issued Mar. 23, 1999.

BACKGROUND OF THE INVENTION

1. Field of the Invention

The present invention relates to a polishing apparatus for polishing a workpiece such as a semiconductor wafer to a flat mirror finish, and more particularly to a polishing apparatus having a liquid leakage monitoring device.

2. Descriptiuon of the Related Art

Recent rapid progress in semiconductor device integration demands smaller and smaller wiring patterns or interconnections and also narrower spaces between interconnections which connect active areas. One of the processes available for forming such interconnections is photolithography. Though the photolithographic process can form interconnections that are at most 0.5 $\mu$m wide, it requires that surfaces on which pattern images are to be focused by a stepper be as flat as possible because the depth of focus of the optical system is relatively small.

It is therefore necessary to make the surfaces of semiconductor wafers flat for photolithography. One customary way of flattening the surfaces of semiconductor wafers is to polish them with a polishing apparatus, and such a process is called Chemical Mechanical polishing.

Conventionally, a polishing apparatus has a polishing section having a turntable and a top ring which rotate at respective individual speeds. A polishing cloth is attached to the upper surface of the turntable. A semiconductor wafer to be polished is placed on the polishing cloth and clamped between the top ring and the turntable. An abrasive liquid containing abrasive grains is supplied onto the polishing cloth and retained on the polishing cloth. During operation, the top ring exerts a certain pressure on the turntable, and the surface of the semiconductor wafer held against the polishing cloth is there fore polished by a combination of chemical polishing and mechanical polishing to a flat mirror finish while the top ring and the turntable are rotated.

After, for example, one or more semiconductor wafers have been polished, the polishing cloth is processed to recover its original polishing capability. Various processes have been and are being developed for restoring the polishing cloth, and are collectively called "dressing". The polishing cloth is dressed by a dressing tool installed in the polishing apparatus in order to enable the polishing apparatus to perform a good polishing function at all times without undesired degradation of a polishing performance.

Some polishing apparatuses incorporate a cleaning section for conveying semiconductor wafers and cleaning the semiconductor wafers. The cleaning section comprises a workpiece conveying robot for taking a semiconductor wafer out of a cassette and delivering the semiconductor wafer to the polishing section having the turntable and the top ring, a cleaning device for cleaning the semiconductor wafer which has been polished, and a drying device for drying the semiconductor wafer which has been cleaned.

The polishing apparatus further comprises an abrasive liquid supply device which supplies abrasive liquid to the polishing section, and a cooling water supply device which supplies cooling water to the polishing section and the like.

The polishing section, the cleaning section, the abrasive liquid supply device, and the cooling water supply device are in danger of a liquid leakage due to an unexpected failure of some internal devices thereof because they use various liquids or hold various liquids therein. Therefore, it is desirable that when liquid leakage occurs in the above sections and devices, i.e. the occurrence of such leakage being a predetermined malfunction such liquid leakage is quickly detected and stopped.

SUMMARY OF THE INVENTION

It is therefore an object of the present invention to provide a polishing apparatus which can quickly detect a liquid leakage and stop it without operator intervention.

According to one aspect of the present invention, there is provided a polishing apparatus for polishing a surface of a workpiece comprising: a polishing section for polishing a surface of a workpiece; a cleaning section for cleaning the workpiece which has been polished; a first liquid leakage sensor provided in said polishing section for detecting a liquid leakage which occurs in said polishing section; a second liquid leakage sensor provided in said cleaning section for detecting a liquid leakage which occurs in said cleaning section; and a controlling device for stopping the supply of liquid to said polishing section or said cleaning section in which said liquid leakage occurs when either one of said first and second liquid leakage sensors detects said liquid leakage.

According to another aspect of the present invention, there is provided a polishing apparatus for polishing a surface of a workpiece comprising: a polishing section for polishing a surface of a workpiece; a cleaning section for cleaning the workpiece which has been polished; an abrasive liquid supply device for supplying abrasive liquid to a polishing surface in the polishing section; a temperature adjusting device for adjusting temperature of liquid which is supplied to at least one of the polishing section, the cleaning section and the abrasive liquid supply device; a plurality of liquid leakage sensors provided respectively in the polishing section, the cleaning section, the abrasive liquid supply device and the temperature adjusting device for detecting a liquid leakage which occurs in the polishing section, the cleaning section, the abrasive liquid supply device and the temperature adjusting device; a liquid supply stop device for stopping the supply of liquid to the polishing section, the cleaning section, the abrasive liquid supply device and the temperature adjusting device; and a controlling device for stopping the supply of liquid to the polishing section, the cleaning section, the abrasive liquid supply device, or the temperature adjusting device in which the liquid leakage occurs when at least one of the liquid leakage sensors detects the liquid leakage.

The above and other objects, features, and advantages of the present invention will become apparent from the following description when taken in conjunction with the accompanying drawings which illustrate a preferred embodiment of the present invention by way of example.

BRIEF DESCRIPTION OF THE DRAWINGS

FIG. 2 is a cross-sectional view showing a polishing section of the polishing apparatus;

FIG. 7 is a cross-sectional view showing a cooling water supply device in the polishing apparatus;

FIG. 9 is a table illustrative of a control process carried out by the liquid leakage monitoring device when liquid leakage occurs.

DETAILED DESCRIPTION OF THE PREFERRED EMBODIMENT

A polishing apparatus having a liquid leakage monitoring device according to an embodiment of the present invention will be described below with reference to FIGS. 1 through 9.

Figure 1:
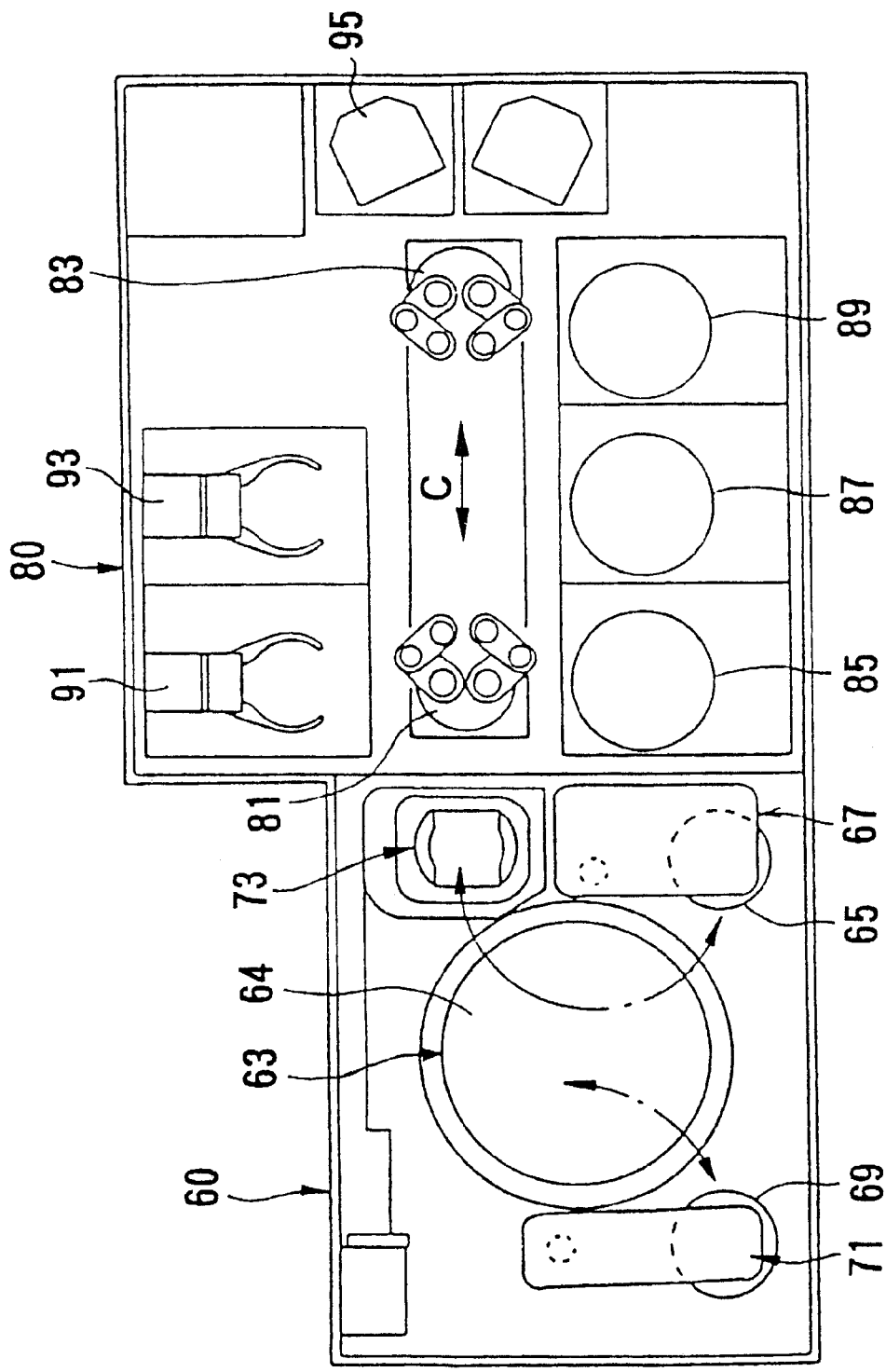
FIG. 1 is a plan view of a polishing apparatus having a liquid leakage monitoring device according to an embodiment of the present invention.

As shown in FIG. 1, a polishing apparatus comprises a polishing section 60 for polishing a workpiece such as a semiconductor wafer, and a cleaning section 80 for cleaning the workpiece which has been polished in the polishing section 60. The polishing section 60 comprises a central turntable 63, a polishing unit 67 disposed on one side of the turntable 63 and having a top ring 65, a dressing unit 71 disposed on the other side of the turntable 63 and having a dressing tool 69, and a workpiece transfer device 73 for transferring the workpiece between the top ring 65 and the workpiece transfer device 73.

The cleaning section 80 comprises a pair of central workpiece conveying robots 81, 83 movable in the directions indicated by the arrow C, primary and secondary cleaning devices 85, 87 and a spinning drier 89 which are arranged in an array on one side of the workpiece conveying robots 81, 83, and two workpiece reversing device 91, 93 which are arranged in an array on the other side of the workpiece conveying robots 81, 83.

FIG. 2 shows the polishing section having the turntable 63, the top ring unit 67 and the dressing unit 71. The top ring unit 67 has the top ring 65 for supporting a semiconductor wafer 50 and pressing the semiconductor wafer 50 against the turntable 63. The turntable 63 is rotatable about its own axis as indicated by an arrow by a motor (not shown) which is coupled to the turntable 63. A polishing cloth 51 constituting a polishing surface 64 is attached to an upper surface of the turntable 63.

The top ring 65 is coupled to a motor (not shown) and also to a lifting/lowering cylinder (not shown). The top ring 65 is vertically movable and rotatable about its own axis as indicated by the arrows by the motor and the lifting/lowering cylinder. The top ring 65 can therefore press the semiconductor wafer 50 against the polishing cloth 51 under a desired pressure. The semiconductor wafer 50 is attached to a lower surface of the top ring 65 under a vacuum or the like. A guide ring 66 is mounted on the outer circumferential edge of the lower surface of the top ring 65 for preventing the semiconductor wafer 50 from being disengaged from the top ring 65. An abrasive liquid is circulated in abrasive liquid circulation pipes 205, 207, and a portion of abrasive liquid is withdrawn from the abrasive liquid circulation pipes 205, 207 by an abrasive liquid withdrawal device 52, and then supplied through a supply pipe 53 onto the polishing cloth 51.

Dressing unit 71 comprises a dressing tool 69 which is positioned above the turntable 63 in diametrically opposite relation to the top ring 65. Pure water as dressing liquid is supplied through a supply pipe 54 connected to a pure water supply pipe 209 onto the polishing cloth 51. The dressing tool 69 is coupled to a motor (not shown) and also to a lifting/lowering cylinder (not shown). The dressing tool 69 is vertically movable and rotatable about its own axis as indicated by the arrows by the motor and the lifting/lowering cylinder. The dressing tool 69 has a dressing layer 69a composed of, for example, a diamond grain layer containing diamond grains on its lower surface.

When a wafer cassette 95 which houses a plurality of semiconductor wafers to be polished is set in a position as shown in FIG. 1, the workpiece conveying robot 83 takes a semiconductor wafer out of the cassette 95, and transfers the semiconductor wafer to the workpiece reversing unit 93. After the semiconductor wafer is reversed, i.e., turned upside down, by the workpiece reversing unit 93, it is received by the workpiece conveying robot 81, and then placed onto the workpiece transfer device 73 by the workpiece conveying robot 81.

Thereafter, the top ring 65 of the polishing unit 67 is angularly displaced as indicated by the dot-and-dash line to a position directly above the workpiece transfer device 73. The semiconductor wafer on the workpiece transfer device 73 is lifted to a position near a lower surface of the top ring 65, and then attached to the top ring 65 under vacuum developed by a vacuum pump or the like (not shown).

Then, the top ring 65 is moved over the turntable 63, and presses the semiconductor wafer against the polishing surface 64 on the turntable 63. While the turntable 63 and the top ring 65 are rotated independently of each other, the lower surface of the semiconductor wafer is polished to a flat mirror finish. At this time, abrasive liquid is supplied through the supply pipe 53 onto the polishing surface 64. After the semiconductor wafer is polished, the top ring 65 is moved back over the workpiece transfer device 73, and transfers the polished semiconductor wafer onto the workpiece transfer device 73.

The semiconductor wafer placed on the workpiece transfer device 73 is then held by the workpiece conveying robot 81, and transferred therefrom to the workpiece reversing unit 91. The workpiece reversing unit 91 reverses the semiconductor wafer. The reversed semiconductor wafer is transferred successively to the primary and secondary cleaning devices 85 and 87, and the spinning drier 89, whereby the semiconductor wafer is cleaned by cleaning liquid such as pure water and dried. The spinning drier 89 may have a function of cleaning and drying. The cleaned and dried semiconductor wafer is finally returned to the cassette 95 by the workpiece conveying robot 83.

After the semiconductor wafer is polished, the dressing tool 69 of the dressing unit 71 is angularly moved over the turntable 63 as indicated by the dot-and dash-line arrow, and then presses the dressing tool 69 against the polishing surface 64 for thereby dressing the polishing surface 64. At this time, pure water is supplied as dressing liquid through the supply pipe 54 onto the polishing surface 64.

Figure 3:
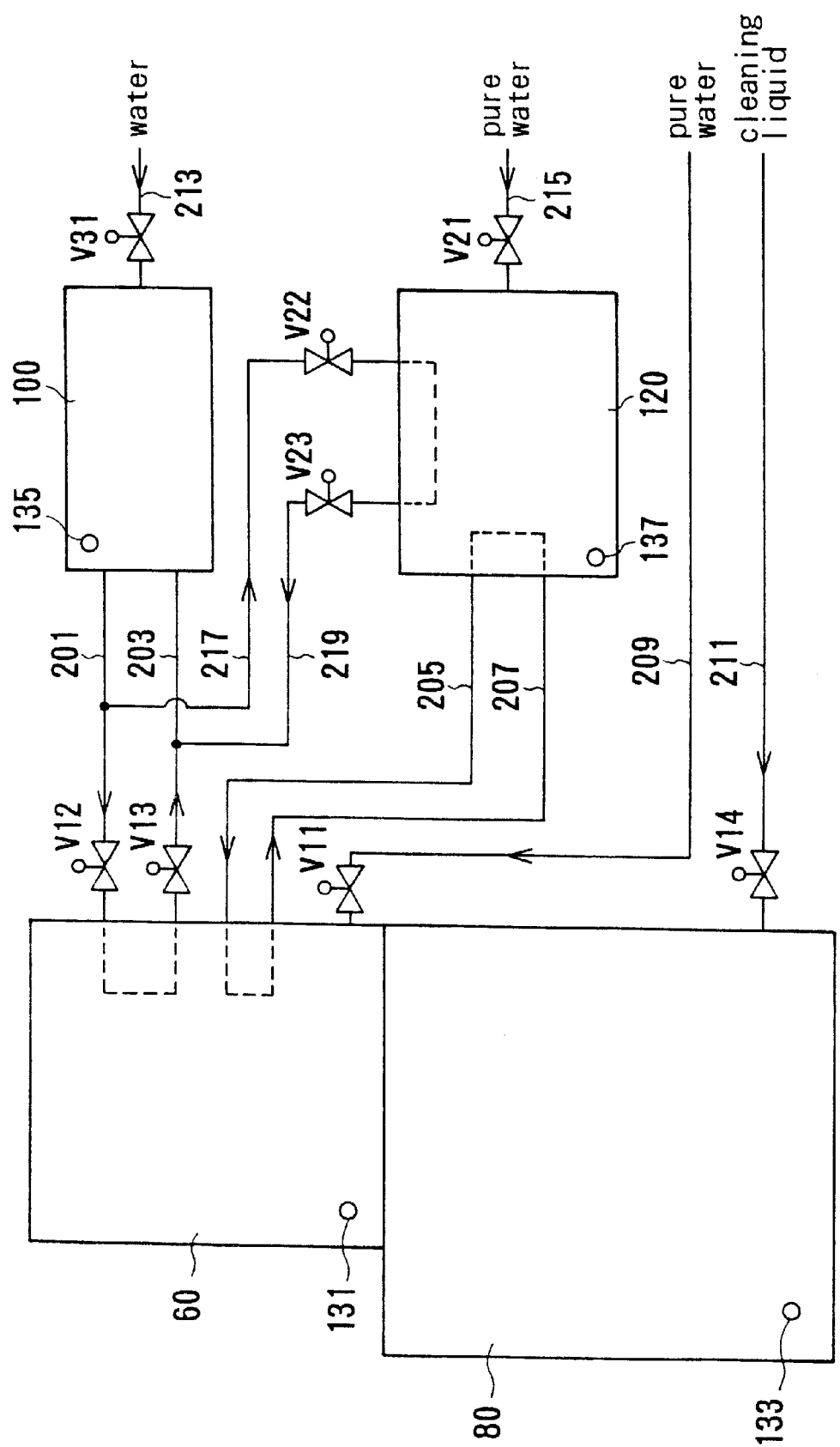
FIG. 3 is a schematic view of a liquid supply system in the polishing apparatus of FIG. 1.

FIG. 3 shows a liquid supply system for supplying liquid to the polishing section 60, the cleaning section 80, a cooling water supply device 100, and an abrasive liquid supply device 120.

As shown in FIG. 3, cooling water circulation pipes 201, 203 from the cooling water supply device 100, abrasive liquid circulation pipes 205, 207 from the abrasive liquid supply device 120, and a pure water supply pipe 209 from a pure water supply facility (not shown) are connected to the polishing section 60. Cooling water supplied from the cooling water supply device 100 is used to remove heat generated on the polishing surface 64 of the turntable 63 when the semiconductor wafer is polished by the polishing surface 64, for thereby keeping the polishing surface 64 at a constant temperature. That is, cooling water is supplied to a cooling water jacket in the turntable 63 for thereby cooling the polishing surface 64 of the turntable 63. Since abrasive liquid contains sedimentary or colloidal solid particles, there is a possibility that the solid particles are precipitated to clog the pipe during stagnation of abrasive liquid. Therefore, abrasive liquid is required to be circulated at all times. When the semiconductor wafer is polished, a certain amount of abrasive liquid is withdrawn from the abrasive liquid circulating pipes 205, 207 by the abrasive liquid withdrawal device 52 comprising a valve or a pump, and the withdrawn abrasive liquid is supplied onto the polishing surface 64 on the turntable 63.

A cleaning liquid supply pipe 211 from a cleaning liquid supply facility (not shown) is connected to the cleaning section 80. Pure water may be used as cleaning liquid. Further, acidic cleaning liquid, alkaline cleaning liquid, surfactant and organic solvent which are diluted with pure water may be used as cleaning liquid. Pure water containing dissolved gas such as ozone or carbon dioxide may also be used as cleaning liquid. Normally, pure water, or pure water and one or more chemicals selected from the above chemicals, is used as cleaning liquid. A plurality of pipes for supplying cleaning liquid may be provided in accordance with kinds of cleaning liquid. Further, in order to obtain the desired cleaning effect, a temperature adjusting device for adjusting temperature of cleaning liquid may be provided in the cleaning section 80.

The cooling water supply device 100 is connected through a cooling water supply pipe 213 to a water supply facility (not shown). Water supplied from the water supply facility is cooled in the cooling water supply device 100, and the cooled water is circulated through the cooling water circulation pipes 201, 203 by the cooling water supply device 100.

The abrasive liquid supply device 120 is connected through a pure water supply pipe 215 to a pure water supply facility. Pure water supplied from the pure water supply facility is used to dilute abrasive liquid. Cooling water circulation pipes 217, 219 are branched from the pipes 201, 203 and inserted into the abrasive liquid supply device 120. Cooling water supplied from the cooling water circulation pipes 217, 219 to the abrasive liquid supply device 120 is used to keep the abrasive liquid at a constant temperature because the abrasive liquid tends to be heated when it is stirred in the abrasive liquid supply device 120.

Shutoff valves V12, V13 and V11 are provided in the respective pipes 201, 203 and 209 at their junctions to the polishing section 60. A shutoff valve V14 is provided in the pipe 211 at its junction to the cleaning section 80. Shutoff valves V21, V22 and V23 are provided in the respective pipes 215, 217 and 219 at their junctions to the abrasive liquid supply device 120. A shutoff valve V31 is provided in the pipe 213 at its junction to the cooling water supply device 100. the shutoff valves V11–V31 are controlled for opening and closing operations thereof by controllers described below.

Each of the polishing section 60, the cleaning section 80, the cooling water supply device 100, and the abrasive liquid supply device 120 has a container (not shown in FIG. 3) at its bottom for retaining liquid that has leaked from each of the sections and the devices, i.e. the occurrence of a malfunction therein. Liquid leakage sensors 131, 133, 135 and 137 are provided in the respective containers at given positions therein. These liquid leakage sensors 131, 133, 135 and 137 may be mounted on drain pipes (not shown) for discharging leakage liquid from the containers.

Figure 4:
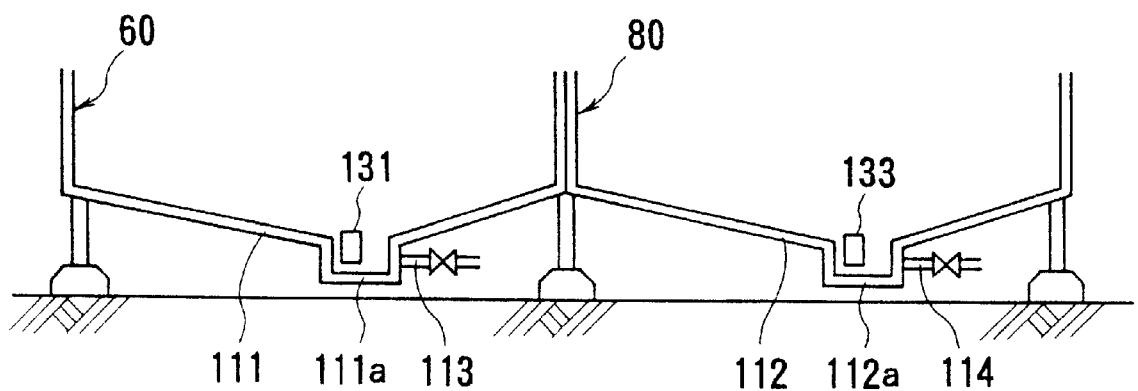
FIG. 4 is a cross-sectional view showing lower portions of a polishing section and a cleaning section in the polishing apparatus.

FIG. 4 shows the lower portions of the polishing section 60 and the cleaning section 80. As shown in FIG. 4, containers 111, 112 are provided at the respective bottoms of the polishing section 60 and the cleaning section 80. The containers 111, 112 are each inclined downwardly from the opposite ends thereof toward a central portion thereof, and have respective reservoir portions 111*a*, 112*a* each in the form of trough. This structure allows leakage liquid to be collected at a certain part of each of the containers 111, 112. The liquid leakage sensors 131, 133 are disposed in the liquid reservoir portions 111*a*, 112*a* of the containers 111, 112, respectively.

In FIG. 4, a float sensor is used as each liquid leakage sensor. The float sensor detects liquid leakage at the time when a certain amount of liquid is stored in the liquid reservoir portions 111*a*, 112*a*, and the float of the sensor is floated.

As the liquid leakage sensor, in addition to the float sensor, a capacitance type sensor which detects liquid leakage by change of capacitance, a photosensor which detects liquid leakage by change of quantity of reflected light or transmitted light, an ultrasonic wave sensor which detects liquid leakage by reflection distance of an ultrasonic wave, a ribbon sensor which detects liquid leakage by change of current when two electrodes embedded in a ribbon-like cloth are soaked in liquid, or any other types of sensors may be used. Drain pipes 113, 114 are connected to the liquid reservoir portions 111*a*, 112*a* of the containers 111, 112, respectively.

Figure 5:
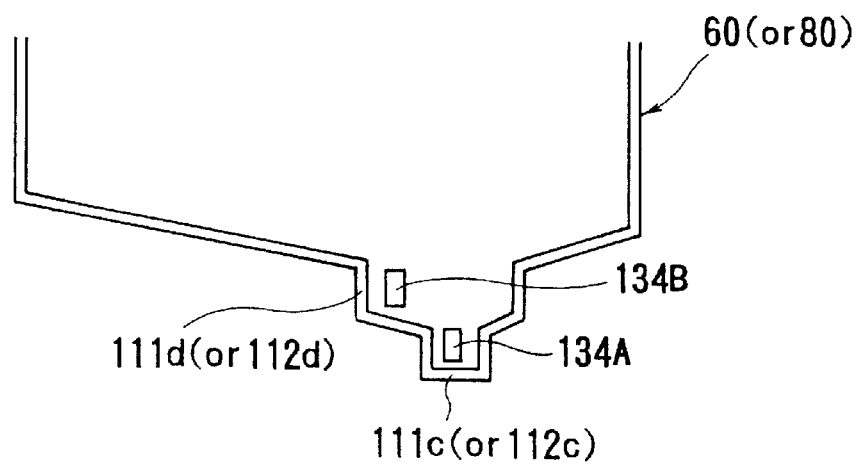
FIG. 5 is a cross-sectional view showing a modified embodiment of FIG. 4.

FIG. 5 is a cross-sectional view of an example in which two sensors are provided as a liquid leakage sensor. As shown in FIG. 5, a first-stage liquid leakage sensor 134A and a second-stage liquid leakage sensor 134B are provided in the polishing section 60 and/or the cleaning section 80. The first-stage liquid leakage sensor 134A is provided in a lower liquid reservoir portion 111*c* (or 112*c*), and the second-stage liquid leakage sensor 134B is provided in an upper liquid reservoir portion 111*d* (or 112*d*). In this manner, a small amount of liquid leakage is detected by the first-stage sensor 134A to thereby draw an operator's attention, and a large amount of liquid leakage is detected by the second-stage sensor 134B to operate a liquid supply stop mechanism. The same effect can be obtained by using two or more kinds of sensors, for example, a combination of the ribbon sensor provided at the bottom of the container and the float sensor provided in the liquid reservoir portion of the container, or a combination of two sensors having different sensitivity.

Figure 6:
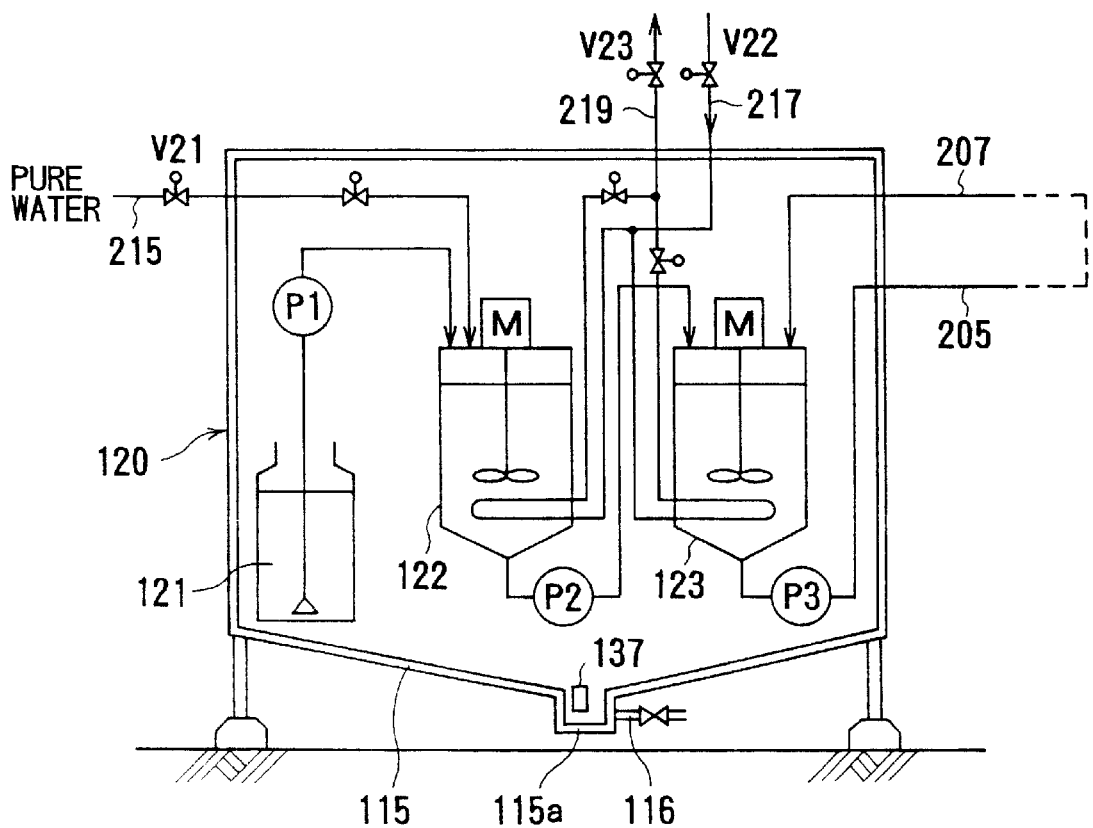
FIG. 6 is a cross-sectional view showing an abrasive liquid supply device in the polishing apparatus.

FIG. 6 is a cross-sectional view showing the abrasive liquid supply device 120. As shown in FIG. 6, the abrasive liquid supply device 120 comprises a liquid reservoir tank 121, a mixing tank 122 and a supply tank 123. The abrasive liquid supply device 120 has a container 115 at a lower part thereof. The container 115 is inclined downwardly from the both ends towards the central portion thereof, and has a liquid reservoir portion 115*a* at the central portion thereof. A liquid leakage sensor 137 is provided in the liquid reservoir portion 115*a*. The liquid leakage sensor 137 may be various kinds of sensors. A drain pipe 116 is connected to the liquid reservoir portion 115*a* of the container 115.

With the above arrangement, concentrated abrasive liquid in the liquid reservoir tank 121 is supplied to the mixing tank 122 by a feed pump P1, and the concentrated abrasive liquid is diluted in the mixing tank 122 with pure water supplied through the pipe 215. The diluted abrasive liquid is supplied to the supply tank 123 by a feed pump P2 and stored in the supply tank 123. The abrasive liquid in the supply tank 123 is circulated through the pipes 205, 207 and the polishing section 60 by an abrasive liquid circulating pump P3. The pipes 217, 219 for circulating cooling water are inserted into the mixing tank 122 and the supply tank 123 to remove heat generated by stirring, for thereby keeping the abrasive liquid at a constant temperature.

FIG. 7 is a cross-sectional view showing the cooling water supply device 100. As shown in FIG. 7, the cooling water supply device 100 comprises a reservoir tank 101 and a cooler 102. Water from the water supply facility is supplied to the reservoir tank 101 through the pipe 213. A float valve 103 is provided in the distal end of the pipe 213. Water supplied to the reservoir tank 101 is cooled by a cooling coil 102a of the cooler 102 to produce cooling water having a low temperature, and the cooling water is circulated in the pipes 201, 203 by a cooling water circulating pump P4. A relief valve (not shown) is provided at a suitable position of the pipes 201, 203 to prevent a bad influence on the cooling water circulating pump P4 when the shutoff valves V12, V13 are closed. Therefore, the polishing surface 64 of the turntable 63 is cooled and the abrasive liquid in the mixing tank 122 and the supply tank 123 is cooled by the circulation of the cooling water. Further, the cooling water supply device 100 may cool the cleaning liquid to be supplied to the cleaning section 80 when necessary.

The cooling water supply device 100 has a container 117, having a flat bottom, at a lower part thereof. The liquid leakage sensor 135 is provided in the container 117. The liquid leakage sensor 135 may be various kinds of sensors as described above. The cooler 102 in the cooling water supply device 100 may be replaced by a heater to thereby construct a warm water supply device. In such case, warm water may be supplied to the polishing section 60 and the abrasive liquid supply device 120 to warm the polishing surface 64 of the turntable 63 and/or abrasive liquid in the abrasive liquid supply device 120. Further, the warm water supply device may warm the cleaning liquid to be supplied to the cleaning section 80 when necessary. That is, the cooling water supply device 100 in FIG. 7 and the foregoing warm water supply device constitute a temperature adjusting device for adjusting temperature of liquid supplied to the polishing section 60 and/or the abrasive liquid supply device 120 and/or the cleaning section 80. A plurality of temperature adjusting devices may be provided so as to cool or warm liquids at different respective temperatures.

Figure 8:
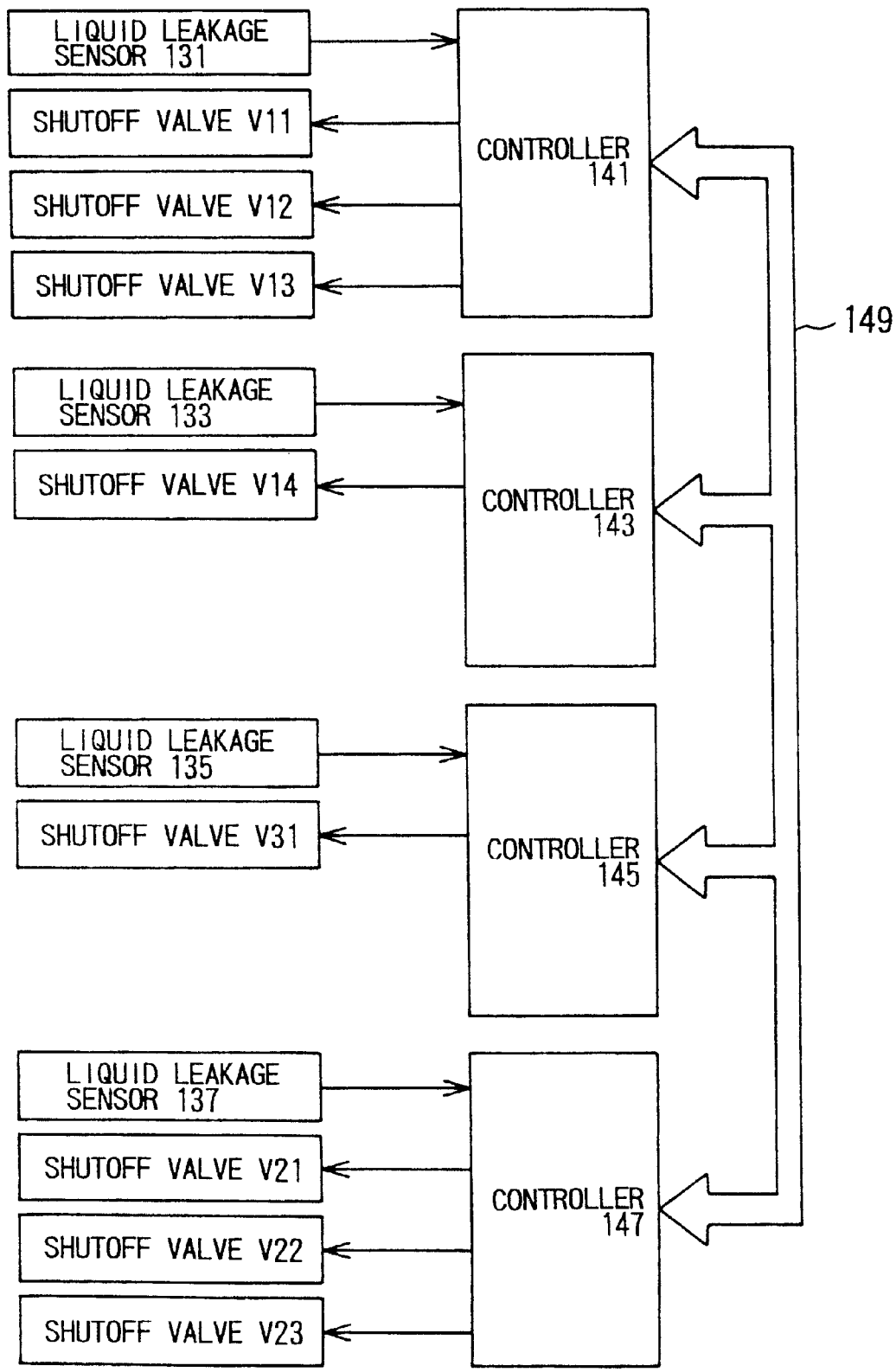
FIG. 8 is a block diagram of controllers of the liquid leakage monitoring device according to the present invention.

FIG. 8 is a block diagram of a controlling device in the liquid leakage monitoring device according to the present invention. As shown in FIG. 8, the controlling device includes a controller 141 for the polishing section 60, a controller 143 for the cleaning section 80, a controller 145 for the cooling water supply device 100, and a controller 147 for the abrasive liquid supply device 120.

The controller 141 controls the operation of the polishing section 60, and also outputs valve opening/closing control signals to the shutoff valves V11, V12 and V13 in response to a signal from the liquid leakage sensor 131.

The controller 143 controls the operation of the cleaning section 80, and also outputs a valve opening/closing control signal to the shutoff valve V14 in response to a signal from the liquid leakage sensor 133.

The controller 145 controls the operation of the cooling water supply device 100, and also outputs a valve opening/closing control signal to the shutoff valve V31 in response to a signal from the liquid leakage sensor 135.

The controller 147 controls the operation of the abrasive liquid supply device 120, and also outputs valve opening/closing control signals to the shutoff valves V21, V22 and V23 in response to a signal from the liquid leakage sensor 137. The controllers 141, 143, 145 and 147 are interconnected by communication lines 149 for transferring various data therebetween when necessary.

FIG. 9 shows a table illustrative of a control process carried out by the liquid leakage monitoring device when a liquid leakage occurs. The control process will be described below with respect to various liquid leakage locations with reference to FIGS. 9, 3 and 8.

When a liquid leakage occurs in the polishing section 60:

The liquid leakage sensor 131 detects the liquid leakage, and sends a detected signal to the controller 141. The controller 141 outputs a control signal to shut off the polishing section 60 and also outputs control signals to close the shutoff valves V11, V12 and V13. A signal is transferred from the controller 141 to the controller 147 to thus shut off the abrasive liquid circulation pump P3 among various pumps in the abrasive liquid supply device 120.

Therefore, the supply of the cooling water, the pure water, and the abrasive liquid to the polishing section 60 is stopped, and the polishing section 60 itself is shut off. Consequently, the liquid leakage from the polishing section 60 is automatically stopped, and will not overflow the container 111 (see FIG. 4).

At this time, the cleaning section 80 continues its operation. Since the polishing section 60 is shut off, the cleaning section 80 will also be shut off according to another operation control process after the cleaning section 80 finishes the cleaning and drying of the semiconductor wafer which has been transferred from the polishing section 60 prior to the liquid leakage.

The cleaning liquid supply apparatus 100 also continues its operation. However, after the polishing section 60 is shut off, the cooling water supplied from the cooling liquid supply device 100 is circulated through the abrasive liquid supply device 120.

When a liquid leakage occurs in the cleaning section 80:

The liquid leakage sensor 133 detects the liquid leakage, and sends a detected signal to the controller 143. the controller 143 outputs a control signal to shut off the cleaning section 80 and also outputs a control signal to close the shutoff valve V14. Therefore, the supply of the cleaning liquid such as pure water to the cleaning section 80 is stopped, and the cleaning section 80 itself is shut off. Consequently, the liquid leakage from the cleaning section 80 is automatically stopped, and will not overflow the container 112 (see FIG. 4).

At this time, the polishing section 60 continues its operation. Since the cleaning section 80 is shut off, the polishing section 60 will also be shut off according to another operation control process after the polishing section 60 finishes the polishing of the semiconductor wafer which has been transferred from the cleaning section 80 prior to the liquid leakage. The cooling water supply device 100 and the abrasive liquid supply device 120 continue their operation.

When a liquid leakage occurs in the cooling water supply device 100:

The liquid leakage sensor 135 detects the liquid leakage, and sends a detected signal to the controller 145. The controller 145 outputs a control signal to shut off the cooling water supply device 100 and also outputs a control signal to close the shutoff valve V31. Therefore, the liquid leakage from the cooling water supply device 100 is automatically stopped, and will not overflow the container 117 (see FIG. 7).

When a liquid leakage occurs in the abrasive liquid supply device 120:

The liquid leakage sensor 137 detects the liquid leakage, and sends a detected signal to the controller 147. The controller 147 outputs a control signal to shut off the abrasive liquid supply device 120 and also outputs control signals to close the shutoff valves V21, V22 and V23.

When the abrasive liquid supply device 120 is; shut off, the abrasive liquid circulation pump P3 and other pumps including the feed pump P1 and a discharge pump in the abrasive liquid supply device 120 are shut off. Therefore, the liquid leakage from the abrasive liquid supply device 120 is automatically stopped, and will not overflow the container 115 (see FIG. 6). At this time, the cleaning section 80 and the cooling water supply device 100 continue their operation. The polishing section 60 is shut off by a signal which is transferred from the controller 147 to the controller 141. The signal transferred to the controller 141 may comprise one of signals indicative of liquid leakage, stop of the abrasive liquid circulation pump, stop of the supply of the abrasive liquid detected by a pressure gauge or a flow meter provided in the pipe for delivering the abrasive liquid, and stop of the abrasive liquid supply device. If the semiconductor wafer is polished without the supply of abrasive liquid, the semiconductor wafer may be damaged or crushed. This causes a great loss because the semiconductor wafer on which integrated circuits are being formed is expensive. When the semiconductor wafer is crushed, the polishing cloth 51 on the turntable 63 is also damaged and thus required to be replaced. A long period of time is required to restart polishing of real semiconductor wafers because a dressing operation and a test operation or confirming a polishing performance using test wafers must be carried out prior to a polishing operation of real semiconductor wafers.

In the illustrated embodiment, the abrasive liquid circulation pipes 205, 207 for supplying the abrasive liquid from the abrasive liquid supply device 120 to the polishing section 60 have no shutoff valves, and the supply of the abrasive liquid from the abrasive liquid supply device 120 to the polishing section 60 is stopped by shutting off the abrasive liquid circulation pump P3 in the abrasive liquid supply device 120. The reasons for such an arrangement are as follow.

With the abrasive liquid supply device 120 in the illustrated embodiment, the abrasive liquid circulation pipes 205, 207 do not have any relief structures. If shutoff valves were provided in the abrasive liquid circulation pipes 205, 207 and were closed, the abrasive liquid circulation pump P3 would possibly be adversely affected. If the abrasive liquid supply device 120 is of such a structure which will not give rise to the above problem, then shutoff valves may be provided in the abrasive liquid circulation pipes 205, 207 and operated to be closed, instead of shutting off the abrasive liquid circulation pump P3.

Without shutting off the shutoff valves associated with the sections 60, 80 and the devices 100, 120, the supply facilities for supplying the cooling water, the pure water, and the cleaning liquid or the pumps in those facilities may be shut off to stop the supply of the cooling water the pure water, and the cleaning liquid.

Consequently, each of the shutoff valves or the supply facilities may comprise a liquid supply stop means for stopping the supply of liquid to an apparatus.

The polishing section 60, the cleaning section 80, the cooling water supply device 100, and the abrasive liquid supply device 120 have been described in the illustrated embodiment. However, the principles of the present invention are also applicable to all liquid handling apparatus including a waste liquid treatment apparatus and a chemical liquid supply apparatus which are used in processing a workpiece to be polished or that has been polished, to achieve a higher level of safety with respect to the workpiece polishing process.

In some applications, the cooling water supply device 100 supplies cooling water to a plurality of the polishing sections 60 and the abrasive liquid supply devices 120 in parallel. In such a case, if the cooling water supply device 100 were shut off immediately upon a liquid leakage caused therein, all the polishing sections 60 would also be shut off, thus possibly greatly affecting polishing processes that are being carried out simultaneously. In order to avoid such occurrence, alarm devices attached to the respective polishing sections 60 may be actuated to alarm, instead of immediately shutting off the abrasive liquid supply device 120 when a liquid leakage occurs in the abrasive liquid supply device 120.

As is apparent from the above description, according to the present invention, since any liquid leakage can be quickly detected and automatically stopped without operator intervention, the leaking liquid is retained in the apparatus and is not discharged therefrom to the outside, even if the operator is not readily available or fails to take any preventive measure.

Further, according to the present invention, the polishing section, the cleaning section, the temperature adjusting device and the abrasive liquid supply device can be operated in close cooperation with one another against liquid leakage in the respective sections and devices.

Although a certain preferred embodiment of t:he present invention has been shown and described in detail, it- should be understood that various changes and modifications may be made thereto without departing from the scope of the appended claims.

What is claimed is:

1. A polishing apparatus for polishing a surface of a workpiece, said apparatus comprising:

a polishing section for polishing the surface of the workpiece;

a cleaning section for cleaning the thus polished workpiece; and a controller operably associated with said cleaning section for controlling operation thereof such that, upon the occurrence of a predetermined malfunction in said polishing section, said controller enables continued operation of said cleaning section to enable cleaning thereby of a polished workpiece that has been transferred to said cleaning section prior to occurrence of said predetermined malfunction, whereafter said controller stops operation of said cleaning section.

2. An apparatus as claimed in claim 1, further comprising a sensor positioned relative to said polishing section to detect said predetermined malfunction, and wherein said controller is operable in response to detection by said sensor.

3. An apparatus as claimed in claim 1, wherein said cleaning section is operable to dry the polished workpiece.

4. A polishing apparatus for polishing a surface of a workpiece, said apparatus comprising:
   a polishing section for polishing the surface of the workpiece;
   a cleaning section for cleaning the thus polished workpiece; and
   a controller operably associated with said polishing section for controlling operation thereof such that, upon the occurrence of a predetermined malfunction in said cleaning section, said controller enables continued operation of said polishing section to enable polishing thereby of a workpiece that has been transferred to said polishing section prior to occurrence of said predetermined malfunction, whereafter said controller stops operation of said polishing section.

5. An apparatus as claimed in claim 4, further comprising a sensor positioned relative to said cleaning section to detect said predetermined malfunction, and wherein said controller is operable in response to detection by said sensor.

* * * * *